United States Patent
Wort

(10) Patent No.: US 9,555,499 B2
(45) Date of Patent: Jan. 31, 2017

(54) METHOD OF CUTTING SUPER-HARD MATERIALS USING AN ELECTRON BEAM AND A RANGE OF BEAM SCANNING VELOCITIES

(71) Applicant: ELEMENT SIX TECHNOLOGIES LIMITED, Didcot (GB)

(72) Inventor: Christopher John Howard Wort, Wantage (GB)

(73) Assignee: Element Six Technologies Limited, Didcot (GB)

( * ) Notice: Subject to any disclaimer, the term of this patent is extended or adjusted under 35 U.S.C. 154(b) by 192 days.

(21) Appl. No.: 14/419,523

(22) PCT Filed: Aug. 14, 2013

(86) PCT No.: PCT/EP2013/066967
§ 371 (c)(1),
(2) Date: Feb. 4, 2015

(87) PCT Pub. No.: WO2014/029671
PCT Pub. Date: Feb. 27, 2014

(65) Prior Publication Data
US 2015/0224594 A1    Aug. 13, 2015

Related U.S. Application Data

(60) Provisional application No. 61/692,469, filed on Aug. 23, 2012.

(30) Foreign Application Priority Data

Aug. 23, 2012   (GB) .................................. 1215002.5

(51) Int. Cl.
B23K 15/08    (2006.01)
B23K 15/10    (2006.01)
(Continued)

(52) U.S. Cl.
CPC ............ *B23K 15/08* (2013.01); *B23K 15/0006* (2013.01); *B23K 15/10* (2013.01); *B28D 5/00* (2013.01);
(Continued)

(58) Field of Classification Search
CPC ..... B23K 15/00; B23K 15/0006; B23K 15/08; B23K 15/10; C30B 33/08; B26D 5/00; H01J 37/31
(Continued)

(56) References Cited

U.S. PATENT DOCUMENTS

| | | | |
|---|---|---|---|
| 3,417,222 A | 12/1968 | Cannon et al. | |
| 4,507,535 A | 3/1985 | Bennett et al. | |
| 2005/0285033 A1* | 12/2005 | Takaoka | G01N 23/00 250/309 |

FOREIGN PATENT DOCUMENTS

| | | |
|---|---|---|
| EP | 0191203 A2 | 8/1986 |
| JP | 60136315 A | 7/1985 |

(Continued)

OTHER PUBLICATIONS

United Kingdom Patent Application No. GB 1215002.5, Search Report mailed Oct. 30, 2012, 4 pages.
(Continued)

*Primary Examiner* — Samuel M Heinrich
(74) *Attorney, Agent, or Firm* — Dean W. Russell; Clark F. Weight; Kilpatrick Townsend & Stockton LLP

(57) ABSTRACT

A method of cutting a super-hard material (8) using an electron beam (6), wherein the electron beam (6) is directed onto a surface of the super-hard material (8) and moved relative to the surface such that the electron beam (6) moves across the surface of the super-hard material (8) at an electron beam scanning velocity in a range 100 to 5000 $mms^{-1}$ to cut the super-hard material (8).

17 Claims, 6 Drawing Sheets

(51) Int. Cl.
 *B23K 15/00* (2006.01)
 *B28D 5/00* (2006.01)
 *H01J 37/31* (2006.01)
 *B26D 5/00* (2006.01)
 *C30B 33/08* (2006.01)

(52) U.S. Cl.
 CPC ............ *B23K 15/00* (2013.01); *B23K 2203/08* (2013.01); *B26D 5/00* (2013.01); *C30B 33/08* (2013.01); *H01J 37/31* (2013.01)

(58) Field of Classification Search
 USPC ............................ 219/121.18, 121.19, 121.2
 See application file for complete search history.

(56) References Cited

FOREIGN PATENT DOCUMENTS

| | | | |
|---|---|---|---|
| JP | 1130888 | A | 5/1989 |
| JP | 2005059071 | A | 3/2005 |
| JP | 2006120431 | A | 5/2006 |
| JP | 2009274085 | A | 11/2009 |

OTHER PUBLICATIONS

International Patent Application No. PCT/EP2013/066967, International Search Report and Written Opinion mailed Dec. 20, 2013, 11 pages.
United Kingdom Patent Application No. GB 1314510.7, Combined Search and Examination Report mailed Jan. 29, 2014, 6 pages.

\* cited by examiner

METHOD OF CUTTING SUPER-HARD MATERIALS USING AN ELECTRON BEAM AND A RANGE OF BEAM SCANNING VELOCITIES

CROSS REFERENCE TO RELATED APPLICATIONS

This application is the U.S. national phase of International Application No. PCT/EP2013/066967 filed on Aug. 14, 2013, and published in English on Feb. 27, 2014 as International Publication No. WO 2014/029671 A1, which application claims priority to Great Britain Patent Application No. 1215002.5 filed on Aug. 23, 2012 and U.S. Provisional Application No. 61/692,469 filed on Aug. 23, 2012, the contents of all of which are incorporated herein by reference.

FIELD OF INVENTION

The present invention relates to a method of cutting super-hard materials.

BACKGROUND OF INVENTION

In the context of the present invention super-hard materials are defined as those materials having a Vickers hardness of no less than 2000 kg/mm$^2$. These materials include a range of diamond materials, cubic boron nitride materials (cBN), sapphire, and composites comprising the aforementioned materials. For example, diamond materials include chemical vapour deposited (CVD) single crystal and polycrystalline synthetic diamond materials of a variety of grades, high pressure high temperature (HPHT) synthetic diamond materials of a variety of grades, natural diamond material, and diamond composite materials such as polycrystalline diamond which includes a metal binder phase (PCD) or silicon cemented diamond (ScD) which includes a silicon/silicon carbide binder phase.

In relation to the above, it should be noted that while super-hard materials are exceeding hard, they are generally very brittle and have low toughness. As such, these materials are notoriously difficult to cut. Any cutting method must be sufficiently aggressive to overcome the extreme hardness of the material to form a cut while at the same time must not impart a large degree of stress or thermal shock to the material which would cause macroscopic fracturing of the material due to its brittle nature and low toughness. As such, there is narrow operating window for achieving successful cutting of super-hard materials and many available cutting methods fall outside this operating window. For example, most cutting methods are not sufficiently aggressive to cut super-hard materials to any significant extent in reasonable time-frames. Conversely, more aggressive cutting techniques tend to impart too much stress and/or thermal shock to the super-hard material thus causing cracking and material failure. Furthermore, certain cutting methods have operational parameters which can be altered so as to move from a regime in which no significant cutting of a super-hard material is achieved into a regime in which cutting is achieved but with associated cracking and failure of the super-hard material. In this case, there may or may not be a transitional window of parameter space in which cutting can be achieved without cracking and failure of the super-hard material. The ability to operate within a suitable window of parameter space in which cutting can be achieved without cracking and failure of the super-hard material will depending on the cutting technique, the size of any transitional operating window for such a technique, and the level of operation parameter control which is possible to maintain cutting within the window of parameter space in which cutting can be achieved without cracking and failure of the super-hard material.

In light of the above, it will be appreciated that cutting of super-hard materials is not a simple process and although a significant body of research has been aimed at addressing this problem current cutting methods are still relatively time consuming and expensive, with cutting costs accounting for a significant proportion of the production costs of super-hard material products.

Super-hard materials are currently cut with one or more of:

(i) wire EDM (Electrical Discharge Machining) machines for electrically conducting materials such as doped CVD synthetic diamond, HPHT synthetic diamond, and cBN products;

(ii) high power lasers for electrically insulating materials such as un-doped CVD synthetic diamond, HPHT synthetic diamond and cBN products; or (iii) cutting saws typically impregnated with other super-hard materials such as diamond.

EDM cutting is efficient for electrically conductive materials, however cannot be used on any insulating materials. Traditional saws can be used for providing small cuts, but become time and cost inefficient when used for bulk processing, as well as struggling to provide good cuts at high depths. To obtain efficient cutting with lasers, the beams need to be focused to a small, very intense spot. Whilst a focused beam is very suitable for relatively thin products, the kerf losses, due to the fact the beam is divergent, having been focused down from a relatively large starting beam, result in a high amount of material wastage and increased laser cutting time when cutting thicker materials. This becomes a major problem when large, single crystals of CVD synthetic diamond or slugs of cBN need to be cut into relatively thin wafers.

Ideally, any method for cutting super-hard materials would provide a combination of the following features:

(i) a low kerf loss, e.g. using a highly collimated cutting beam;

(ii) a high cutting rate and reduced cutting time;

(iii) a high degree of flexibility such that the cutting technology can be applied to a range of super-hard materials;

(iv) a high degree of controllability to achieve precise control of cutting location, cutting velocity, cutting depth, and cutting width; and (v) a low degree of material damage to achieve cutting of a super-hard material without causing damage such as cracking of the material.

The aforementioned advantageous technical features must also be balanced against the economic viability of any cutting technique which is to be used in a commercial process. Economic viability will be dependent on:

(i) initial hardware costs; and (ii) operating costs including:

a. the cost of consumables such as power and gas supplies;

b. the cost of maintenance and the lifetime of the cutting apparatus which will be dependent to some extent on the complexity and reliability of the cutting apparatus;

c. operational cutting time versus down-time which will be dependent on the time required to set up the cutting apparatus between cutting operations; and d. personnel costs, e.g. if skilled operators are required to run the apparatus which again will depend to some extent on the complexity and reliability of the cutting apparatus.

Given the above requirements for a commercial cutting process for super-hard materials, EDM cutting has become the industry standard for electrically conductive super-hard materials whereas high powered lasers have become the industry standard for cutting electrically insulating super-hard materials. While high powered lasers could also be used for cutting electrically conductive super-hard materials EDM cutting is often preferred due to reduced capital and running costs when compared to laser cutting.

The present inventors have re-visited the problem of cutting super-hard materials to assess whether any alternatives exists which may provide improved performance compared to the well accepted industry standards. In this regard, the present inventors have identified that electron beam cutting has the potential to out-perform high powered lasers. As previously described, high powered lasers suffer problems of kerf loss and relatively slow cutting speeds, particularly when cutting thick super-hard materials due to the application of a divergent beam. In contrast, electron beams can be made highly collimated with a very small spot size (i.e. a high brightness beam) and thus provide the potential for cutting with reduced kerf losses and potentially at higher cutting rates.

After initiating a research programme to assess the viability of electron beam cutting for super-hard materials, the present inventors found that electron beam cutting of super-hard materials had already been proposed back in the 1960's, prior to the widespread availability of high powered lasers and the establishment of lasers as the industry standard for cutting electrically insulating super-hard materials. For example, U.S. Pat. No. 3,417,222 filed in 1965 discloses an electron beam technique for cutting super-hard materials. Furthermore, U.S. Pat. No. 3,417,222 would appear to give some hints as to why electron beam techniques were not accepted as an industry standard and were ultimately superseded by high powered lasers as discussed below.

Prior to the availability of high powered lasers, methods for processing electrically insulating super-hard materials were generally limited to cleaving, sawing, grinding, and polishing. U.S. Pat. No. 3,417,222 discloses that electron beam cutting techniques were also devised for cutting super-hard materials such as diamond. U.S. Pat. No. 3,417,222 further discloses that electron beam cutting techniques involve complicated and expensive apparatus which limited the commercial acceptance of such techniques. For example, it is disclosed that a typical electron beam apparatus available at the time required the use of multi-chambered vacuum vessels and complex vacuum pumping systems. It is stated that such apparatus is costly and successful operation demands so much of the operator's attention to control the vacuum pumps that little time is available for observing and controlling the cutting operation.

In consequence of the above, U.S. Pat. No. 3,417,222 suggests the use of a more simple electron beam apparatus design using a single chamber vacuum system serviced by a single vacuum pumping system. However, the present inventors note that any such vacuum system adds a level of complexity and cost which is not required by laser technology and is presumably the key reason why laser technology appears to have entirely superseded electron beam technology for cutting super-hard materials such as diamond. In this regard, it may be noted that electron beam cutting was never widely accepted as a suitable choice for commercial cutting of super-hard materials and laser cutting has become so ubiquitous that many skilled persons in the art of super-hard materials cutting at the time of writing this specification would be unaware of the early work relating to the use of electron beam cutting for super-hard materials.

Despite the above, it would appear that U.S. Pat. No. 3,417,222 suggests some reasonably good cutting performance using their electron beam cutting technique. The apparatus described in U.S. Pat. No. 3,417,222 is configured to provide a focussed electron beam at a point on a material sample held in a specially adapted vice mounted on a movable table. Cutting is achieved by moving the table such that the material sample is moved relative to the electron beam. A gas lance is provided for directing a gas stream onto the material sample at the focus point of the electron beam. It is described that the gas stream improves the quality of the cut and the cutting rate. An example is given for cutting diamond material using an oxygen gas stream. It is stated that providing a stream of oxygen at the focus point of the electron beam can increase the cutting rate of diamond by a factor of 5 and suggests that a 1-carat gem can be cut in about 10 minutes using this technique rather than a time as long as 8 hours required using conventional sawing. Given that a factor of 5 improvement in cutting speed is reported for the electron beam cutting technique using an oxygen gas flow when compared with a comparable electron beam cutting technique without an oxygen gas flow, this would suggest that a 1-carat gem can be cut in about 50 minutes using the technique without oxygen gas flow. In this regard, it is interesting to note that an equivalent cutting process using a high powered laser would take of the order of 40 minutes which is intermediate between the two electron beam cutting times with or without the use of an oxygen gas stream.

In light of the above, it would appear that the electron beam cutting technique using an oxygen gas stream is actually slightly quicker than a high powered laser technique although still of the same order of 10's of minutes. It is supposed that this apparent cutting rate advantage for the electron beam technique when compared with high powered lasers was not sufficient to off-set the higher costs and complexity associated with the electron beam cutting technique and is why laser technology appears to have entirely superseded electron beam technology for cutting super-hard materials such as diamond.

U.S. Pat. No. 3,417,222 discloses cutting diamond with an electron beam at an acceleration voltage of 130 kV. It is also disclosed that by using an oxygen gas stream the electron beam current can be reduced from 10 mA to less than 1 mA. It is also disclosed that in the absence of the oxygen gas the electron beam must be employed at a slow pulse rate in order to minimize crystal breakage during cutting while the addition of an oxygen gas stream enables a substantially continuous smooth cutting by pulsing the electron beam at a very rapid rate of about 35 counts per second thus increasing cutting rate.

U.S. Pat. No. 3,417,222 thus appears to recognize that crystal breakage is a problem when using an electron beam cutting technique and proposes to use a pulsed electron beam having a low current and a gas stream directed at the electron beam focal point on the material being cut in order to alleviate this problem.

The present inventors have also found that cracking and crystal breakage is problematic when using an electron beam cutting technique for super-hard materials such as diamond. In fact, several years prior to the present invention the present inventors trialed electron beam cutting for super-hard materials and discounted the technique for this reason. As previously mentioned, while super-hard materials are exceeding hard, they are generally very brittle and have low toughness. As such, electron beam cutting has been dismissed in the past as being a suitable choice for cutting super-hard materials. Furthermore, while using a pulsed electron beam having a low current and a gas stream as described in U.S. Pat. No. 3,417,222 may alleviate these problems, the use of a low current electron beam significantly reduces cutting rates to a similar order of magnitude to that achievable using more simple, lower cost laser systems.

In contrast to the above, the present inventors have developed a new electron beam cutting technique for super-hard materials which provides a cutting time improvement of over an order of magnitude (even up to two or three orders of magnitude for certain super-hard materials) when compared with both the electron beam cutting technique described in U.S. Pat. No. 3,417,222 and current high powered lasers, thus more than off-setting the higher costs and complexity associated with an electron beam cutting technique. A summary of the new electron beam cutting technique and how it differs from that described in U.S. Pat. No. 3,417,222 is given in the following summary of invention section with detailed embodiments set out thereafter in the detailed description.

SUMMARY OF INVENTION

The present inventors have now found that by moving an electron beam across the surface of a super-hard material at a very high scanning velocity to form a shallow cut it possible to utilize higher electron beam currents and achieve increases in cutting rate of over two or three orders in magnitude without any significant non-localized cracking or breakage of the crystal material, i.e. a cutting rate of over 100 (and even over 1000) times that of current high powered laser techniques.

In light of the above, according to a first aspect of the present invention there is provided a method of cutting a super-hard material using an electron beam, wherein the electron beam is directed onto a surface of the super-hard material and moved relative to the surface such that the electron beam moves across the surface of the super-hard material at an electron beam scanning velocity in a range 100 to 5000 mms$^{-1}$ to cut the super-hard material.

A multi-pass cutting process may then be used to cut to larger depths by repeated high scanning velocity passes over a cutting line. In some respects the multi-pass cutting process is similar to that used in current laser cutting systems but at much higher scanning velocities and using an electron beam rather than a laser.

The optimal electron beam scanning velocity will depend on the nature of the material being cut and a range of electron beam parameters as discussed in more detail below. However, initial data indicates that at electron beam scanning velocities of below 100 mm/s cracking and crystal breakage are problematic due to excessive thermal stress at the cutting location and/or excessive localised fracturing extending beyond the cutting location. In contrast, electron beam velocities above 5000 mm/s will not provide sufficient thermal stress and/or local fracturing at the cutting location to achieve any significant depth of cut.

While it is believed that the widest feasible window for electron beam scanning velocity in accordance with the cutting method of embodiments of the present invention is in the range 100 to 5000 mms$^{-1}$, optionally the electron beam scanning velocity is no less than 200 mms$^{-1}$, 400 mms$^{-1}$, 600 mms$^{-1}$, 800 mms$^{-1}$, 1000 mms$^{-1}$, 1200 mms$^{-1}$, or 1400 mms$^{-1}$. Furthermore, optionally the electron beam scanning velocity is no more than 4500 mms$^{-1}$, 4000 mms$^{-1}$, 3500 mms$^{-1}$, 3000 mms$^{-1}$, 2500 mms$^{-1}$, 2000 mms$^{-1}$, 1800 mms$^{-1}$, or 1600 mms$^{-1}$. Ideal electron beam scanning velocity for certain super-hard materials is in a range 500-1500 mms$^{-1}$ although, as previously indicated, it is envisaged that the optimal scanning velocity will vary somewhat according to the specific super-hard material being cut and other electron beam parameters as discussed in more detail below.

One may postulate as to why previous research into electron beam cutting of super-hard materials, such as that described in U.S. Pat. No. 3,417,222, has not disclosed this advantageous cutting method. One possibility, at least in relation to the electron beam cutting method described in U.S. Pat. No. 3,417,222, is that the cutting apparatus was not configured to move the electron beam relative to the surface of the super-hard material at such high scanning velocities and thus this high scanning velocity parameter space was not assessed. In this regard, it is noted that U.S. Pat. No. 3,417,222 describes that to achieve cutting a static electron beam was focussed onto a super-hard material and relative movement between the electron beam and the super-hard material being cut was achieved by moving the super-hard material on a movable mounting stage. That is, the electron beam was fixed. It is postulated that the movable table of the apparatus described in U.S. Pat. No. 3,417,222 may not have been configured to access a high scanning velocity regime.

In accordance with preferred embodiments of the present invention, relative movement of the electron beam and the super-hard material is achieved by providing an apparatus configuration in which the electron beam is steerable. Using such a configuration, cutting is achieved by controlling and steering the electron beam rather than moving the super-hard material to be cut relative to a fixed electron beam. While preferred embodiments utilize such an electron beam steering configuration, given the teachings of the present invention as described herein it is also envisaged that a high scanning velocity movable mounting could be provided such that the super-hard material to be cut can be moved at a high scanning velocity relative to a fixed electron beam. That said, it is envisaged that such a configuration will not be as precisely controllable as a steerable electron beam configuration.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
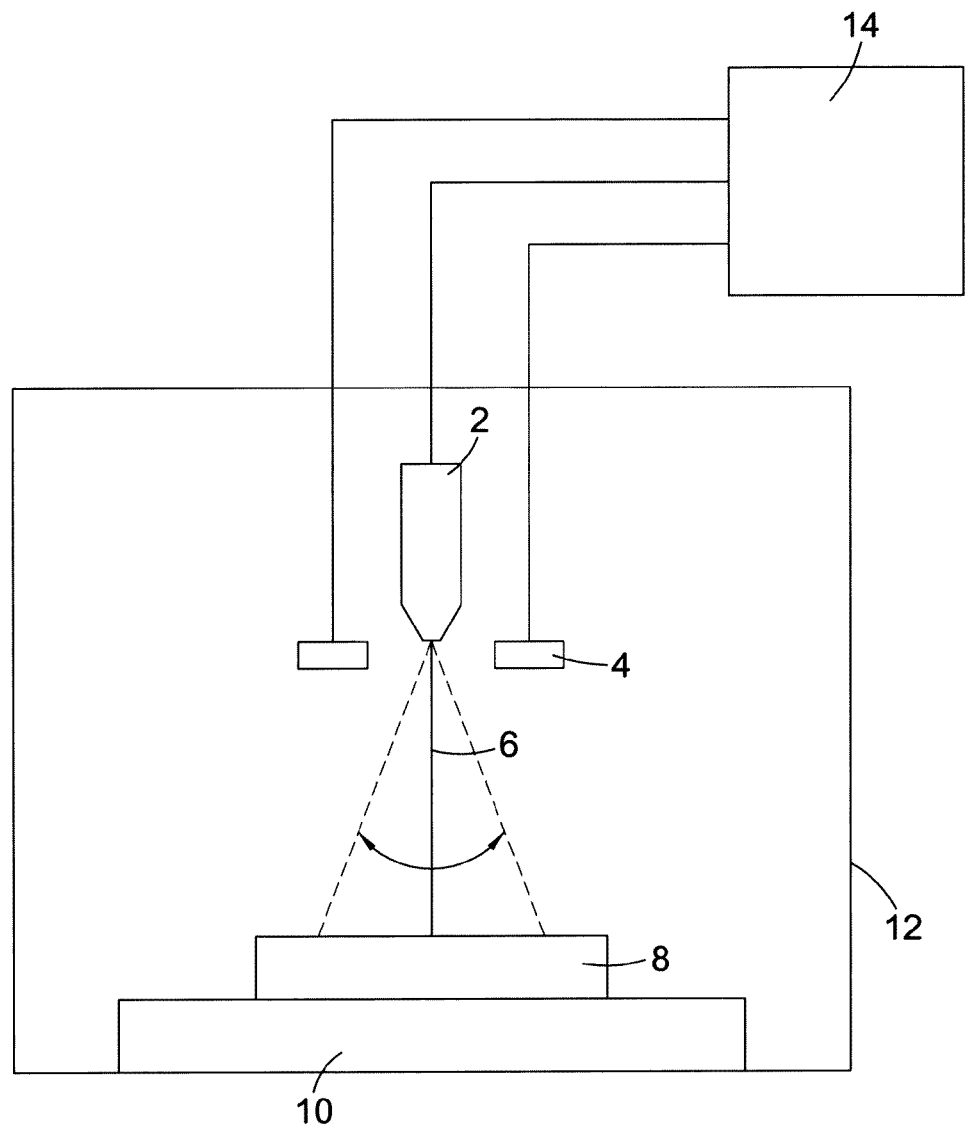
FIG. 1 is a simple schematic diagram illustrating the main components of an electron beam cutting apparatus.

As discussed in the summary of invention section, a first aspect of the present invention is concerned with a method of cutting a super-hard material using an electron beam, wherein the electron beam is moved across the surface of the super-hard material at a high scanning velocity. By moving the electron beam at a high scanning velocity it has been found that problems of cracking and crystal damage can be alleviated. Furthermore, a high scanning velocity electron beam cutting method allows the use of high electron beam currents thus achieving higher cutting speeds without causing cracking and crystal damage due to excessive thermal stress and/or local fracturing at the cutting location. The inventors have also found that there is a "trade-off" between cutting speed, cut depth, and cut width (determined by electron penetration depth and scattering length, a function of material density and electron energy) which can be optimized for different super-hard materials.

Advantageously, the electron beam may comprise one or more of the following characteristics:

(i) a collimated beam of electrons where the divergence half-angle is less than 5 degrees, preferably less than 3 degrees, and more preferably less than 1 degree;

(ii) a beam current in a range 5 mA to 120 mA; optionally no less than 10 mA, 15 mA, 20 mA, 30 mA, 40 mA, 50 mA, 60 mA, or 70 mA; optionally no more than 110 mA, 100 mA, 90 mA, 85 mA, or 80 mA; and optionally within a range defined by any combination of the aforementioned upper and lower bounds;

(iii) an accelerating voltage in a range 10 kV to 200 kV; optionally no less than 15 kV, 20 kV, 25 kV, 30 kV, or 35 kV; optionally no more than 150 kV, 125 kV, 100 kV, 90 kV, 80 kV, 70 kV, or 65 kV; and optionally within a range defined by any combination of the aforementioned upper and lower bounds;

(iv) an electron beam spot size at a point of contact on the super-hard material in a range 5 μm to 500 μm; optionally no more than 500 μm, 300 μm, 100 μm, 50 μm, or 30 μm; optionally no less than 10 μm, 15 μm, or 20 μm; and optionally within a range defined by any combination of the aforementioned upper and lower bounds;

(v) an input line energy, as defined by (accelerating voltage×beam current)/(electron beam scanning velocity), in a range 500 to 30000 $Jm^{-1}$; optionally no more than 25000 $Jm^{-1}$, 20000 $Jm^{-1}$, 15000 $Jm^{-1}$, 10000 $Jm^{-1}$, 5000 $Jm^{-1}$, or 1600 $Jm^{-1}$; optionally no less than 800 $Jm^{-1}$, 1100 $Jm^{-1}$, 1500 $Jm^{-1}$, 2000 $Jm^{-1}$, 5000 $Jm^{-1}$, or 10000 $Jm^{-1}$; and optionally within a range defined by any combination of the aforementioned upper and lower bounds;

(vi) surface energy density, as defined by (accelerating voltage×beam current)/(electron beam scanning velocity×beam width), in a range 10 to 600 $MJm^{-2}$; optionally no more than 500 $MJm^{-2}$, 400 $MJm^{-2}$, 300 $MJm^{-2}$, 200 $MJm^{-2}$, 100 $MJm^{-2}$, or 32 $MJm^{-2}$; optionally no less than 16 $MJm^{-2}$, 22 $MJm^{-2}$, 30 $MJm^{-2}$, 40 $MJm^{-2}$, 100 $MJm^{-2}$, or 200 $MJm^{-2}$; and optionally within a range defined by any combination of the aforementioned upper and lower bounds;

(vii) an energy per unit volume of material volatilized, as defined by (accelerating voltage×beam current)/(electron beam scanning velocity×½×cut width×cut depth) and/or (input line energy)/(cut cross sectional area), in a range 100 to 2500 $GJm^{-3}$; optionally no more than 2300 $GJm^{-3}$, 2000 $GJm^{-3}$, 1700 $GJm^{-3}$, 1400 $GJm^{-3}$, 1100 $GJm^{-3}$, 800 $GJm^{-3}$, or 600 $GJm^{-3}$; optionally no less than 150 $GJm^{-3}$, 200 $GJm^{-3}$, 250 $GJm^{-3}$, 300 $GJm^{-3}$, 350 $GJm^{-3}$, 400 $GJm^{-3}$, 450 $GJm^{-3}$, or 500 $GJm^{-3}$; optionally within a range defined by any combination of the aforementioned upper and lower bounds.

The optimal value for each beam parameter will depend to some extent on the values of the other beam parameters selected and the exact nature of the super-hard material being cut. However, in general the aforementioned electron beam parameters have been found to achieve good quality cutting of super-hard materials at a high cutting rate without substantial cracking and crystal damage. Each of the electron beam parameters is discussed in more detail below.

Electron beam spot size at a point of contact on the super-hard material may lie in a range 5 μm to 500 μm with examples of narrower ranges defined as 10 μm to 300 μm, 10 μm to 200 μm, 15 μm to 100 μm, or 20 μm to 50 μm. Furthermore, the electron beam is advantageously highly collimated such that it possesses a divergent half-angle of no more than 5 degrees, 2 degrees, or 1 degree. As stated in the background section, one problem with the use of high powered lasers to cut super-hard materials is laser beams need to be focused to a small, very intense spot causing kerf losses due to the fact the beam is divergent, having been focused down from a relatively large starting beam. This results in a high amount of material wastage and increased laser cutting time, particularly when cutting thicker samples of super-hard material. In contrast, electron beams can be highly collimated with a low degree of divergence. As such, kerf losses can be reduced and a smooth, finer cut can be achieved at faster cutting rates.

Beam currents may lie in a range from 5 mA to 120 mA with examples of narrower operating ranges defined as 15 mA to 110 mA, 20 mA to 100 mA, 30 mA to 90 mA, 40 mA to 85 mA, 50 mA to 80 mA, 60 mA to 80 mA, or 70 mA to 80 mA depending on the other beam parameters and the exact nature of the material being cut. If the beam current is too low then little cutting occurs while if the beam current is too high then cracking and crystal damage becomes problematic. However, the present inventors have found that higher beam currents are advantageous as they give a faster cutting rate at most voltages. Furthermore, the present inventors have found that by moving the electron beam at high scanning velocity it is possible to access relatively high beam currents without causing cracking and crystal damage of the super-hard material. As such, the beam current is preferably no less than 5 mA, 10 mA, or 15 mA and most preferably significantly higher with an optimum for certain super-hard materials lying around 70 to 80 mA at an accelerating voltage of 35 kV and 20 to 40 mA at 65 kV. This contrasts with the teachings of U.S. Pat. No. 3,417,222 which suggests that the beam current should be reduced to less than 1 mA to reduce crystal breakage and material loss.

Accelerating voltages may lie in a range 10 kV to 200 kV with examples of narrower operating ranges defined as 15 kV to 125 kV, 20 kV to 100 kV, 25 kV to 75 kV, 30 kV to 50 kV, or 35 kV to 45 kV depending on the other beam parameters and the exact nature of the material being cut. If the accelerating voltage is too low then little cutting occurs while if the accelerating voltage is too high then cracking and crystal damage becomes problematic. Following the logic set out above for the beam current parameter, one might expect that higher voltages would be preferable to give a faster cutting rate. However, the present inventors have found that different accelerating voltages can result in different cutting mechanisms with a transition between different cutting modes occurring around 80 kV for certain super-hard materials such as CVD synthetic diamond. In particular, at higher accelerating voltages above about 80 kV a non-thermal cutting mode has been observed which involves heavy localized fracturing within a cut. The resultant cut is somewhat ragged but chemically clean. In contrast, a thermal cutting mode which results in a smooth but graphitized cut has been observed when operating at lower accelerating voltages, typically when also operating at high beam currents. Lower voltages reduce penetration depth and scattering of high energy electrons therefore allowing a finer, smoother cut. As such, it is believed that when a fine, smooth cut is desired then it is advantage to ensure that an accelerating voltage does not significantly exceed 80 kV, e.g. an accelerating voltage of no more than 80 kV and preferably significantly lower with an optimum for certain super-hard materials lying around 35 to 65 kV. This contrasts with the teachings of U.S. Pat. No. 3,417,222 which suggests the use of an electron beam with an accelerating voltage of 130 kV. It is considered that U.S. Pat. No. 3,417,222 teaches the use of a relatively high accelerating voltage in combination with a very low beam current. The present inventors believe that this would result in a somewhat ragged cut and a relatively low cutting rate given the very low beam current taught in U.S. Pat. No. 3,417,222. In contrast, preferred embodiments of the present invention utilize a relatively low accelerating voltage and a high beam current.

Thus far, it has been indicated that high beam velocities are advantageous and particularly so in combination with low accelerating voltages, high beam currents, and highly collimated electron beams. In addition, the input line energy that the electron beam applies to the super-hard material at the point of cutting must be sufficiently high to achieve sufficient heating and a high cutting rate while not been too high that cracking and crystal breakage occurs. The input line energy may be defined by (accelerating voltage×beam current)/(electron beam scanning velocity×beam width) and may lie in a range 500 to 30000 $Jm^{-1}$ with examples of narrower ranges defined as 800 $Jm^{-1}$ to 25000 $Jm^{-1}$, 1100 $Jm^{-1}$ to 20000 $Jm^{-1}$, 1500 $Jm^{-1}$ to 15000 $Jm^{-1}$, 2000 $Jm^{-1}$ to 10000 $Jm^{-1}$, or 3000 $Jm^{-1}$ to 5000 $Jm^{-1}$. The input line energy will be dependent upon the electron beam spot size with finer (higher brightness) electron beams requiring less input line energy.

In addition to input line energy discussed above, the surface energy density is another useful parameter for defining an optimal electron beam cutting regime for super-hard materials. The surface energy density is the energy per unit area that the electron beam applies to the super-hard material during cutting and may be defined by (accelerating voltage×beam current)/(electron beam scanning velocity×beam width) which is equivalent to (input line energy)/(electron beam width). The surface energy density may lie in a range 10 to 600 $MJm^{-2}$ with examples of narrower ranges defined as 16 $MJm^{-2}$ to 500 $MJm^{-2}$, 22 $MJm^{-2}$ to 400 $MJm^{-2}$, 30 $MJm^{-2}$ to 300 $MJm^{-2}$, 40 $MJm^{-2}$ to 200 $MJm^{-2}$, or 60 $MJm^{-2}$ to 100 $MJm^{-2}$. This parameter reflects the fact that surface energy density delivered to the super-hard material at the point of cutting will increase with increasing accelerating voltage and beam current, and will decrease with increasing electron beam scanning velocity and spot size. If surface energy density is below 10 $MJm^{-2}$ then it has been found that substantially no cutting occurs, at least for certain super-hard materials. Conversely, if surface energy density is above 600 $MJm^{-2}$ then it has been found that cracking and crystal breakage occurs, at least for certain super-hard materials. Ideally, the surface energy density should be as high as possible to achieve a high cutting rate while not been too high as to cause cracking and crystal breakage.

Yet another useful parameter for defining an optimal electron beam cutting regime for super-hard materials is the energy per unit volume of material volatilized, as defined by (accelerating voltage×beam current)/(electron beam scanning velocity×½×cut width×cut depth) which is equivalent to (input line energy)/(cut cross sectional area) assuming a cross-sectional cut which is v-shaped. By providing a relatively high surface energy density as previously described the energy per unit volume of material volatilized is decreased and therefore the efficiency of the cutting process is increased. This, of course, must be off-set against the fact that if the surface energy density is made too high then cracking and crystal breakage occurs. As such, ideally the surface energy density should be as high as possible to achieve a high cutting rate and a suitably low energy per unit volume of material volatilized while not been too high as to cause cracking and crystal breakage. It has been found that for achieving a good quality cut of super-hard materials using an electron beam the energy per unit volume of material volatilized may lie in a range an energy per unit volume of material volatilized, as defined by (accelerating voltage×beam current)/(electron beam scanning velocity×½×cut width×cut depth) and/or (input line energy)/(cut cross sectional area), in a range 100 to 2500 $GJm^{-3}$ with examples of narrower ranges defined as 150 $GJm^{-3}$ to 2300 $GJm^{-3}$, 200 $GJm^{-3}$ to 2000 $GJm^{-3}$, 250 $GJm^{-3}$ to 1700 $GJm^{-3}$, 300 $GJm^{-3}$ to 1400 $GJm^{-3}$, 350 $GJm^{-3}$ to 1100 $GJm^{-3}$, 400 $GJm^{-3}$ to 800 $GJm^{-3}$, or 500 $GJm^{-3}$ to 600 $GJm^{-3}$.

As indicated in the background section, preferred embodiments of the present invention utilize a steerable electron beam to achieve cutting by controlling and steering the electron beam rather than moving the super-hard material to be cut relative to a fixed electron beam. High power electron beam sources are now available in electron beam welding apparatus. Furthermore, high scanning velocity electron beam cutting techniques have been made possible in part by developments in the field of metal welding including developments in electromagnetic steering of electron beams and highly collimated, and optionally pulsed, electron guns for metal welding applications. Electromagnetic electron beam control gives very fast beam manipulation which can be utilized to avoid the super-hard material locally overheating and fracturing. It has surprisingly been found that these developments in metal welding technology are transferable to the field of super-hard materials for cutting applications with remarkable improvements in cutting performance.

FIG. 1 shows a simple schematic diagram illustrating the main components of an electron beam cutting apparatus as described above. The apparatus comprises an electron gun 2 and an electromagnetic steering configuration 4 for moving an electron beam 6 as indicated by the dotted lines and arrow. A super-hard material sample 8 is mounted on a sample holder 10 in a position such that the electron beam 6 can be moved over the sample 8 by the electromagnetic steering configuration 4 to cut the sample. The electron gun 2, electromagnetic steering configuration 4, sample 8, and sample holder 10 are mounted within a vacuum chamber 12. In use the apparatus is evacuated such that at least the space between the electron gun 2 and the sample 8 is free of species which would otherwise scatter the electron beam 6. The electron gun 2 and electromagnetic steering configuration 4 are coupled to a controller 14 which can be programmed with various cutting routines.

Four different cutting modes are accessible, particularly when using electron beam cutting apparatus configured to provide fast beam manipulation as described above. These four cutting modes include: (i) continuous cutting; (ii)

stitching; (iii) quasi-pulsed cutting; or (iv) true pulsed beam cutting. Each of these cutting modes is described below.

Continuous cutting comprises the use of a continuous electron beam which is directed onto the surface of a single super-hard material sample and moved over the single super-hard material sample to cut the sample. For example, the electron beam may be repeatedly moved over the same cut line(s) in a single sample to cut the sample in a continuous manner. The electron beam parameters are controlled to avoid overheating and fracture of the single super-hard material sample as previously described.

Stitching is a variant of continuous cutting in which a series of short passes overlay one another along a cut line with a slight offset along the direction of cut (every pass or at least periodically) to give an overall progression of the cut. This gives separate control of short timescale processes, e.g. the energy surface density, and longer timescale effects such as local volume heating.

Quasi-pulsed cutting also comprises the use of a continuous electron beam which is directed onto the surface of a super-hard material sample and moved over the sample to form a cut line. However, in this case the electron beam is periodically removed from the sample, or at least moved to a different portion of the sample, and then returned to the cut line to continue cutting. Periodically removing the electron beam from the cut line allows the sample to cool, at least locally around the cut line, thus alleviating problems of local over-heating causing fracture of the sample. During formation of the cut line in the super-hard material the electron beam can be periodically moved to a beam dump and then returned to the cut line to continue cutting. However, this method is not efficient as the electron beam spends a portion of time in which it is not performing any cutting when it is directed into the beam dump, thus increasing cutting times and decreasing the power efficiency and cost of the cutting process.

A preferred alternative quasi pulsed cutting technique involves, during the formation of a first cut line in the super-hard material, periodically moving the electron beam to one or more other locations on the surface of the super-hard material or to another sample of super-hard material to form one or more further cut lines and then returning to the first cut line to continue cutting. Periodic switching of the electron beam between cut lines or samples achieves parallel cutting of two or more cut lines in the surface of one or more samples of super-hard material. This is a very efficient cutting mode as the electron beam spends the majority of time cutting. Furthermore, by periodically switching the electron beam between cut lines each individual cut line is given time to locally cool, thus alleviating problems of local over-heating causing fracture of the sample. Such a quasi cutting technique may also be combined with a stitching technique to give additional degrees of freedom in terms of controlling short timescale processes, e.g. the energy surface density, and longer timescale effects such as local volume heating.

Figure 2:
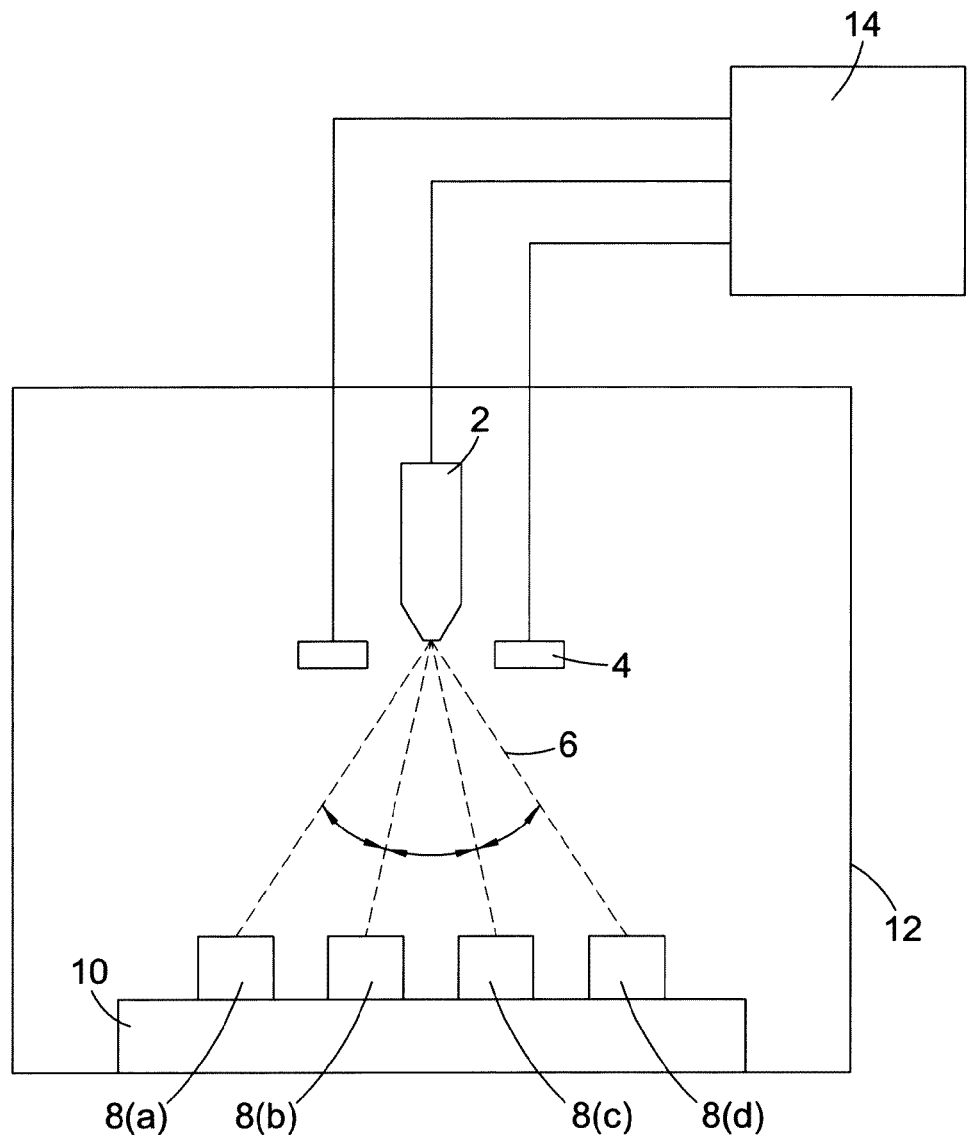
FIG. 2 is a simple schematic diagram illustrating the use of an electron beam cutting apparatus in a quasi-pulsed cutting mode.

FIG. 2 shows a simple schematic diagram illustrating the use of an electron beam cutting apparatus in a quasi-pulsed cutting mode. The main components are the same as those illustrated in FIG. 1 and like reference numbers have been used for like parts. The difference in FIG. 2 is that multiple super-hard material samples $8(a)$ to $8(d)$ have been mounted on the sample holder 10. The controller 14 is programmed to initiate cutting of sample $8(a)$ and periodically switch to cutting of samples $8(b)$, $8(c)$, and $8(d)$ before returning to continue cutting of sample $8(a)$. As such, samples $8(a)$ to $8(d)$ can be parallel processed. As previously described, developments in electromagnetic steering of electron beams for metal welding applications allows the beam to be swung very rapidly between samples such that the beam spends the majority of time cutting. Furthermore, by switching between samples using a pre-programmed cutting routine, overheating of individual samples leading to fracture can be avoided.

A fourth option is to use a truly pulsed electron beam. Electron beam pulsing has been suggested in U.S. Pat. No. 3,417,222 as a means of alleviating the problem of cracking and crystal breakage. A pulsed electron beam in which the beam voltage and/or beam current is periodically reduced or turned off may also be used in embodiments of the present invention. Periodically turning the electron beam off, or at least reducing the acceleration voltage and/or beam current, gives the super-hard material time to locally cool. However, it also reduces cutting rates thus reducing the efficiency of the cutting process. U.S. Pat. No. 3,417,222 describes that the use of a gas stream directed at the point of cutting allows the pulse frequency to be increased thus increasing cutting rates. That is, the time period that the beam is turned off can be reduced. Embodiments of the present invention allow a further reduction in the time period during which the electron beam is turned off as local heat build-up is also alleviated by the fact that the beam is rapidly moved away from a particular point on the surface of the super-hard material.

A pulsed electron beam may be directed onto the surface of a single super-hard material sample and moved over the single super-hard material sample to cut the sample in a similar manner to that previously described for a continuous cutting mode. Alternatively, a pulsed electron beam may be combined with a quasi-pulsed cutting technique by periodic switching of the electron beam between cut lines or samples to achieve parallel cutting of two or more cut lines in the surface of one or more samples of super-hard material. A pulsed beam may also be used with the previously described stitching technique.

While it is envisaged that a pulsed electron beam may be used in accordance with embodiments of the present invention, it should be noted that one advantageous feature of certain embodiments of the present invention is that by utilizing a very high electron beam scanning velocity, and controlling other electron beam parameters as described herein, it is possible to achieve good quality cutting of super-hard materials without the need to use a pulsed electron beam. This is advantageous because pulsing the electron beam inevitable means that for a proportion of time the electron beam it turned off and no cutting is taking place. This results in a less efficient cutting process. As such, pulsing may only be desirable when the other beam parameters are not sufficiently well controlled to achieve good quality cutting without causing cracking and material failure. That is, pulsing can provide another degree of freedom to maintain cutting operation within a suitable window of parameter space when other beam parameters are not sufficiently well controlled and/or if the control necessary for pseudo-pulsing is not available.

A range of super-hard materials can be cut using the electron beam cutting methods described herein including one or more of: a diamond material; a cubic boron nitride material; sapphire; or a composite material comprising one or more of the aforementioned super-hard materials and a binder. For example, the super-hard material may comprise at least 50%, 60%, 70%, 80%, 90%, 95%, or 99% by weight of diamond material. Such materials include single crystal diamond (HPHT, CVD, or natural), polycrystalline diamond (e.g. polycrystalline CVD diamond), nanopolycrystalline diamond (e.g. ultra high pressure high temperature nanopolycrystalline diamond), polycrystalline diamond including a metal binder phase (PCD), and silicon cemented diamond (ScD). In the case of diamond containing super-hard materials, as previously described it has been found to be advantageous to use electron beam with an acceleration voltage no more than 80 kV such that the diamond material is cut via a thermal cutting mode forming a coating of graphite at sides of a cut region.

EXAMPLES

By changing electron beam parameters and significantly increasing the electron beam scanning velocity, cutting rates for a variety of super-hard materials have been dramatically increased. Many controllable and very high speed cuts (up to a maximum of 3000 mms$^{-1}$ compared with laser cutting speeds of less than 20 mms$^{-1}$) have been made in polycrystalline CVD diamond (CVDP). The present inventors have also demonstrated that similar conditions can be used to cut single crystal CVD diamond (CVDSC) and other super-hard materials including composite materials such as: PCD (a diamond cobalt compact material), ABN (a polycrystalline composite of cubic boron nitride and aluminium nitride) and ScD (a silicon cemented diamond composite material).

Based on the experiments undertaken by the inventors, polycrystalline and single crystal CVD diamond, PCD, ABN and ScD can all be controllably cut at high cutting rates in accordance with the present invention. The table below indicates a number of selected examples using an electron beam having an acceleration voltage of 65 keV and a beam current of 20 mA. Cut widths and depths are recited for a single cutting pass.

which is three times deeper than a CVD diamond cut with a typical laser and at ten times faster scanning velocity. This resulted in an overall improvement of thirty times faster cutting speed. Single pass cuts of approximately 68 μm deep could be made when cut at a scanning speed of 750 mms$^{-1}$ using higher beam currents which is only 0.75 times as deep when compared with laser cutting but at a scanning velocity 150 times faster. This resulted in an overall improvement of one hundred times faster cutting speed.

FIGS. 3 to 6 show photographs of several examples of cuts made in accordance with the present invention.

Figure 3:
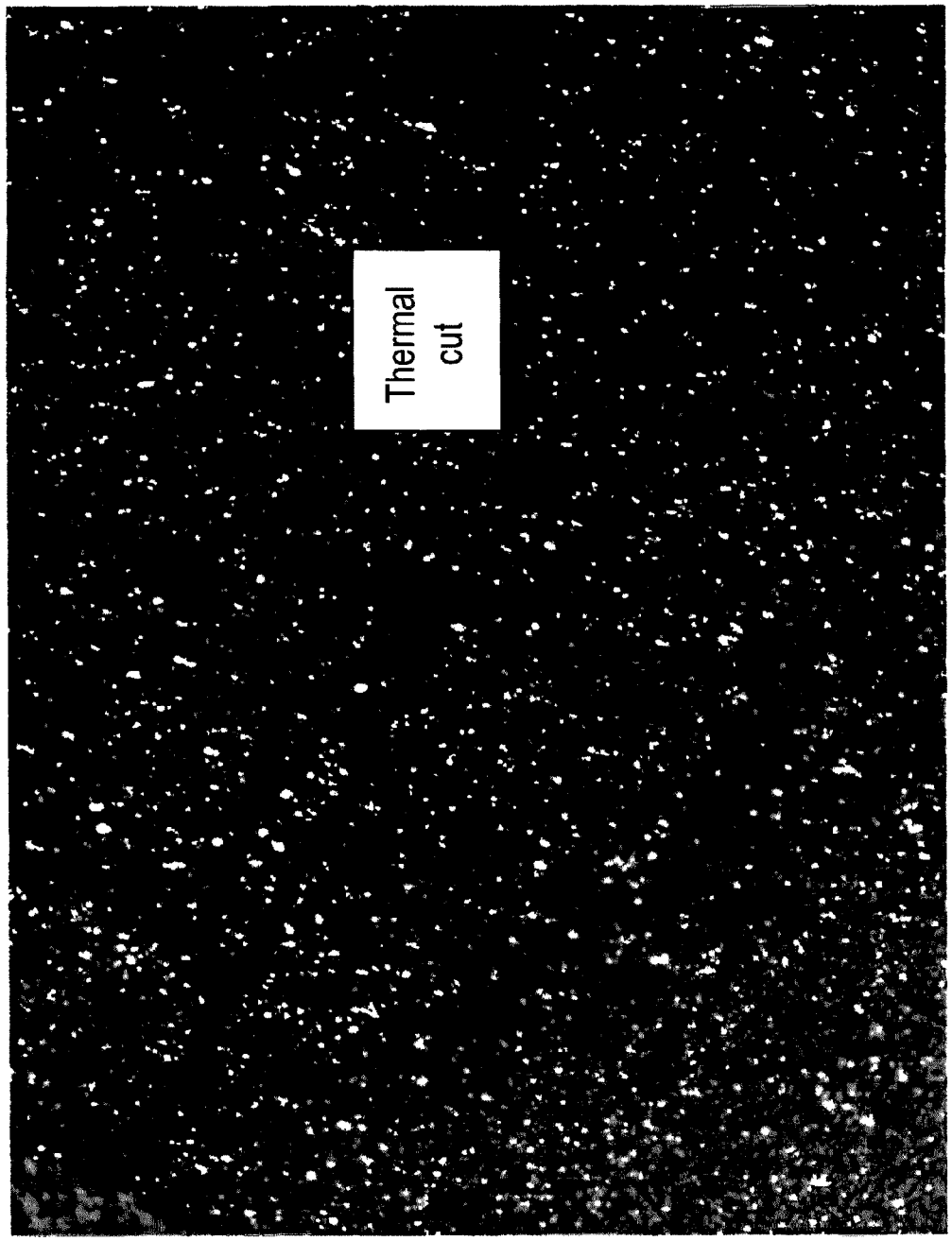
FIGS. 3 to 6 show photographs of several examples of cuts made using electron beam cutting methods in accordance with embodiments of the present invention.

FIG. 3 shows a top view of a cut in the growth surface of polycrystalline CVD diamond material indicating graphitization but no evidence of macroscopic or micro-cracking. The cut has a depth of 94 μm and a width of 125 μm. Using a beam scanning velocity of 1500 mms$^{-1}$ an input line energy of 867 Jm$^{-1}$ was found to be sufficient to cause thermal cutting but insufficient to thermally shock and crack the sample.

Figure 4:
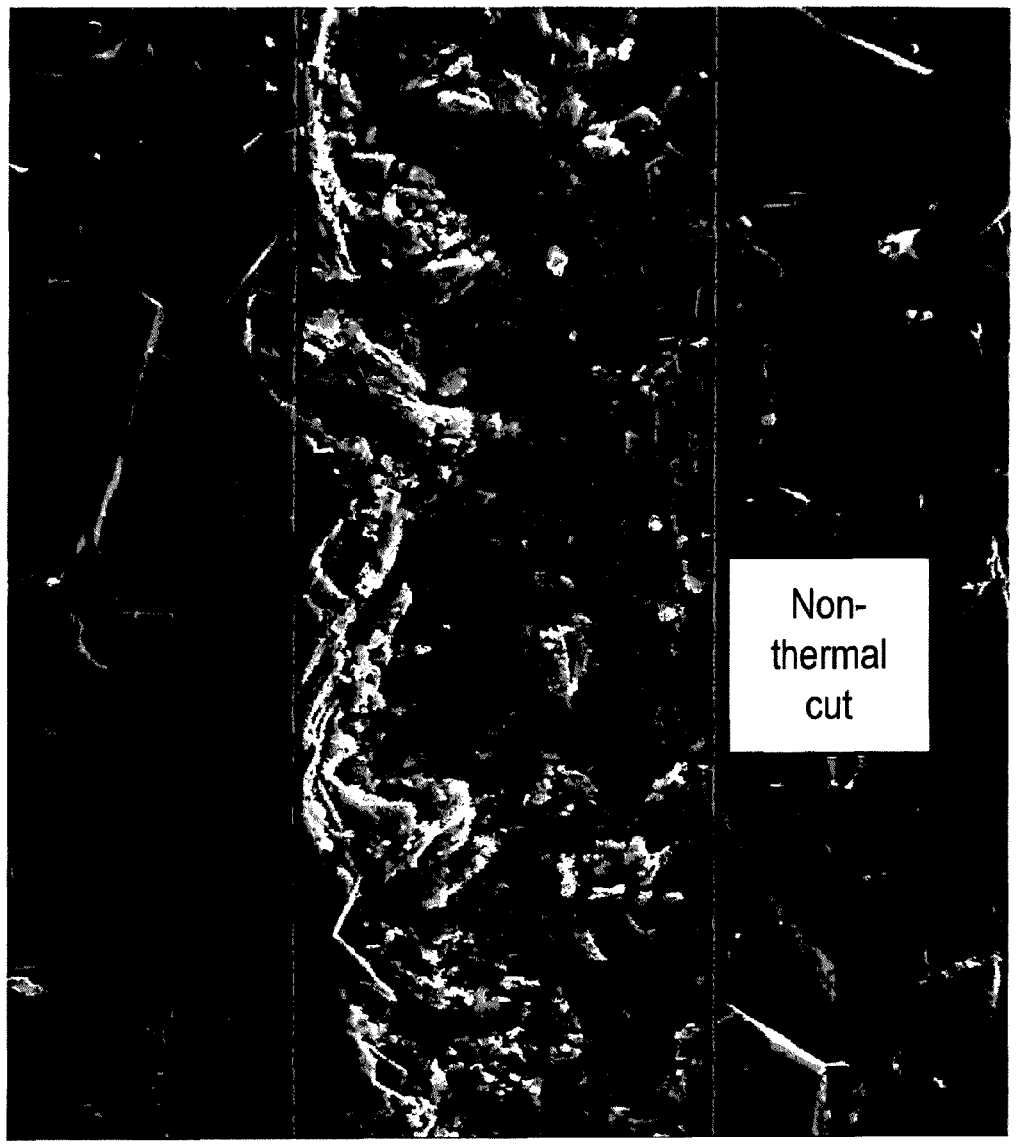

FIG. 4 shows a top view of a cut in the surface of polycrystalline CVD diamond material using an electron beam having an acceleration voltage of 130 keV, a beam current of 20 mA, and a scanning velocity of 3200 mms$^{-1}$. The cut has a depth of 55 μm and a width of 110 μm. The cut shows no evidence of graphitization or macro-cracking and it is believed that the cutting mechanism is by micro-fracturing alone which occurs when the input line energy (in this case 813 Jm$^{-1}$) is insufficient to heat the sample and lead to graphitization.

Figure 5:
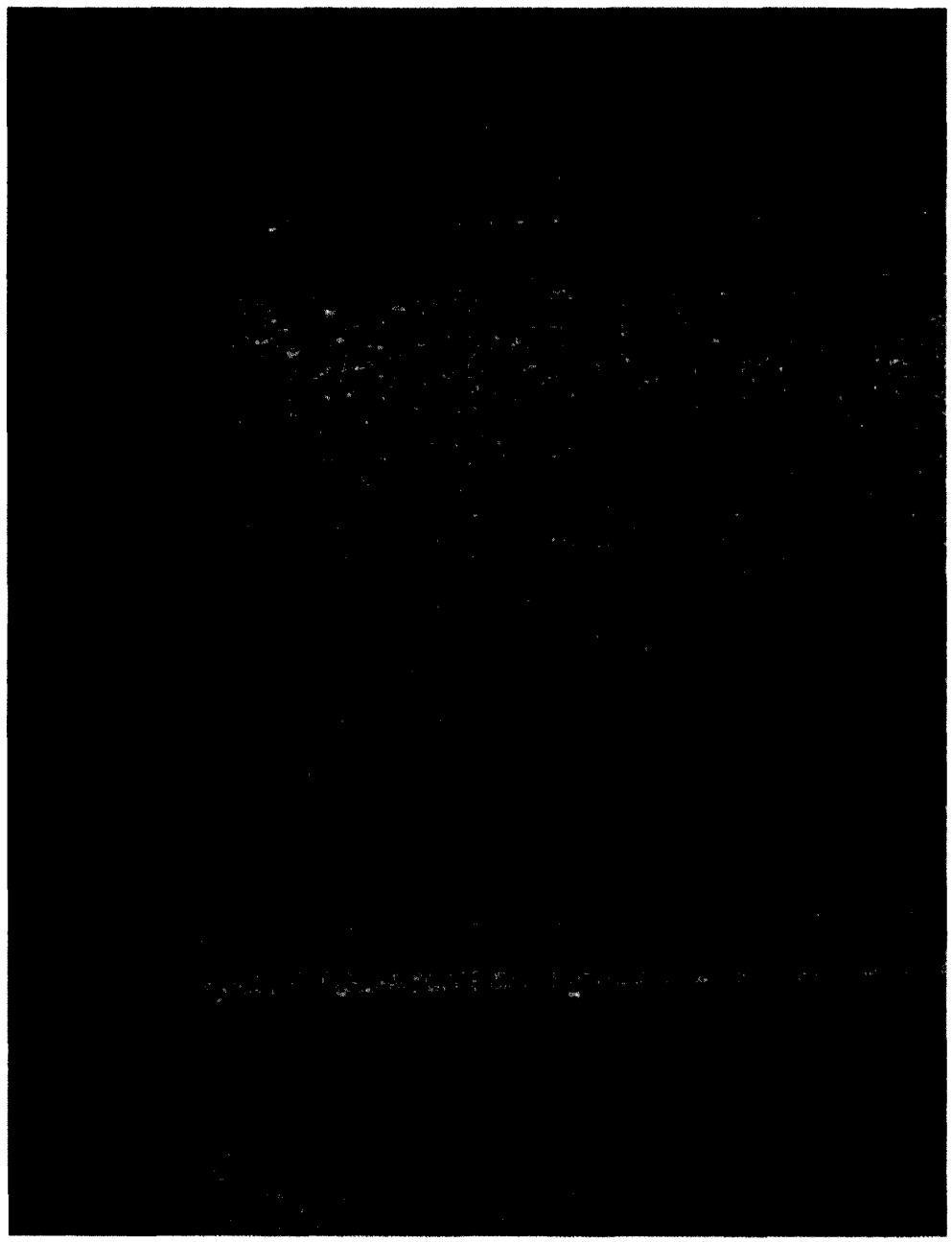
Figure 6:
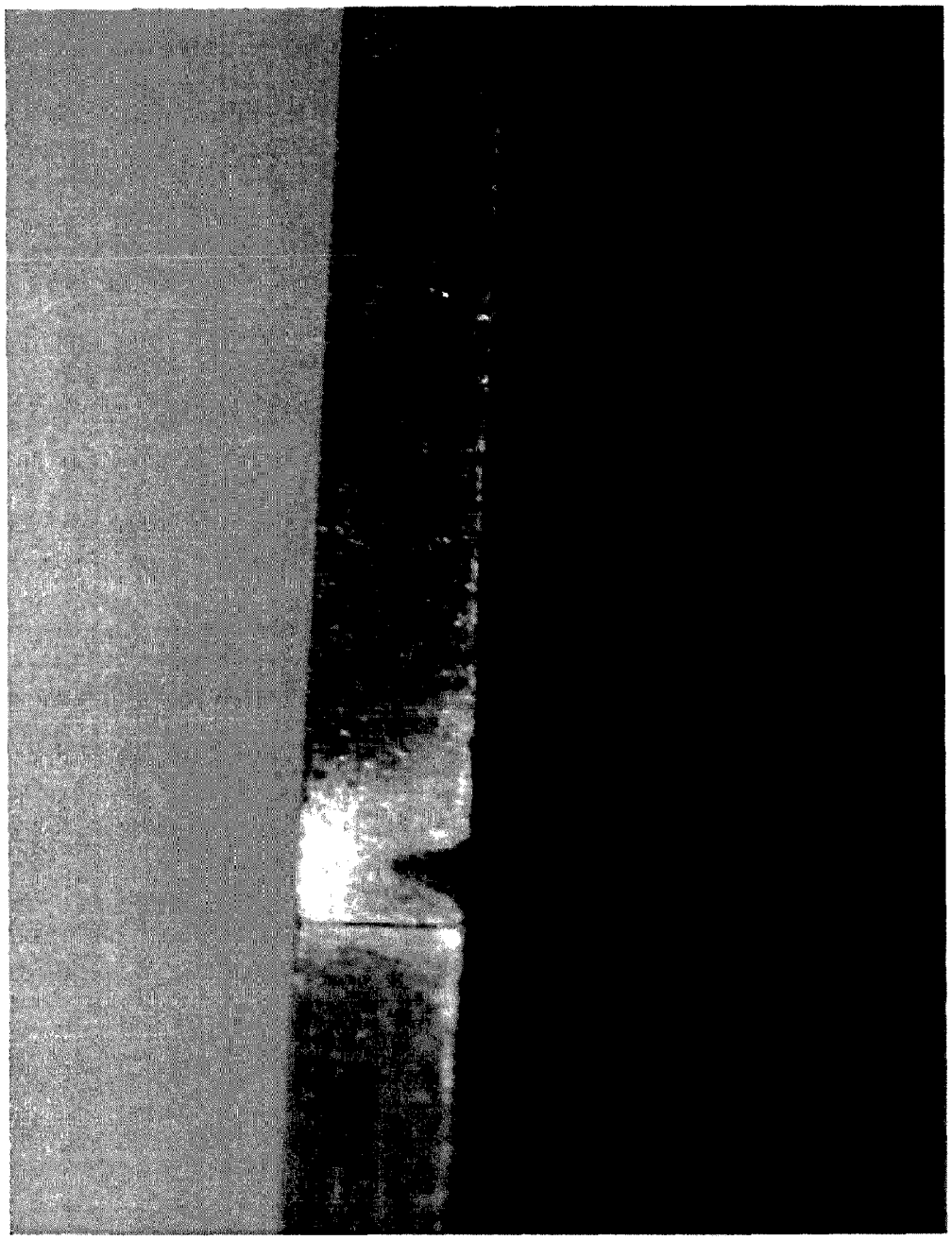

FIG. 5 shows a top view of cuts made in free-standing PcD using an electron beam having an acceleration voltage of 65 keV and a beam current of 20 mA. FIG. 6 is a side view of the cuts illustrated in FIG. 5 showing that the cuts have a "v-groove" cross-sectional shape.

| Material Type | Acceleration Voltage (keV) | Beam Current (mA) | Beam Power (W) | Scanning velocity (m/s) | No. of passes | Cut Depth (μm) | Cut Width (μm) |
|---|---|---|---|---|---|---|---|
| CVDP | 65 | 20 | 1300 | 1.5 | 1 | 28 | 251 |
| CVDP | 65 | 20 | 1300 | 0.75 | 1 | 30 | 200 |
| CVDP | 65 | 20 | 1300 | 0.375 | 1 | 52 | 217 |
| CVDP | 65 | 20 | 1300 | 0.1875 | 1 | 74 | 218 |
| CVDP | 65 | 20 | 1300 | 0.0938 | 1 | 138 | 323 |
| CVDP | 65 | 20 | 1300 | 0.0469 | 1 | 273 | 344 |
| PCD | 65 | 20 | 1300 | 0.75 | 1 | 60 | 335 |
| ScD | 65 | 20 | 1300 | 0.75 | 1 | 57 | 235 |
| ABN | 65 | 20 | 1300 | 0.75 | 1 | 79 | 440 |
| CVDSC | 65 | 20 | 1300 | 0.0938 | 1 | 90 | 300 |

Different scanning rates, beam spot sizes, acceleration voltages, currents, energy input rates, and energy densities have been examined to determine optimal cutting conditions as described herein. Furthermore, trends have been found between these parameters and the cutting rate for a number of super-hard material. Further still, trends have been found between these parameters and the cutting mechanism and cut quality. For example, for polycrystalline CVD synthetic diamond material being cut at 130 keV, an input line energy of greater than 800 Jm$^{-1}$ gives a thermal cutting mechanism and above 1600 Jm$^{-1}$ macro-cracking occurs. At input line energies of less than 800 Jm$^{-1}$ a micro-fracturing cutting mechanism occurs and at input line energies lower than 500 Jm$^{-1}$ no cutting occurs. However, at 65 keV no macro-cracking was seen even at input line energies above 25000 Jm$^{-1}$ and the onset threshold for thermal cutting appears to be around 850-1330 Jm$^{-1}$. Single pass cuts over 250 μm deep could be made at scanning speeds around 50 mms$^{-1}$ While this invention has been particularly shown and described with reference to preferred embodiments, it will be understood to those skilled in the art that various changes in form and detail may be made without departing from the scope of the invention as defined by the appendant claims.

The invention claimed is:

1. A method of cutting a super-hard material using an electron beam, wherein the electron beam is directed onto a surface of the super-hard material and moved relative to the surface such that the electron beam moves across the surface of the super-hard material at an electron beam scanning velocity in a range 100 to 5000 mms$^{-1}$ to cut the super-hard material, wherein the electron beam has a beam current in a range 5 mA to 120 mA, wherein the electron beam has an accelerating voltage in a range 10 kV to 200 kV, wherein the electron beam has a spot size at a point of contact on the super-hard material no more than 500 μm, wherein the electron beam has an input line energy, as defined by (accelerating voltage×beam current)/(electron beam scanning velocity), in a range 500 to 30000 $Jm^{-1}$, wherein the electron beam has a surface energy density, as defined by (accelerating voltage×beam current)/(electron beam scanning velocity×beam width), in a range 10 to 600 $MJm^{-2}$, wherein the electron beam applies an energy per unit volume of super-hard material which is volatilized, as defined by (accelerating voltage×beam current)/(electron beam scanning velocity×cut cross-sectional area), in a range 100 to 2500 $GJm^{-3}$.

2. The method according to claim 1, wherein the electron beam is collimated with a half angle divergence of no more than 5 degrees, 3 degrees, or 1 degree.

3. The method according to claim 1, wherein the electron beam scanning velocity is no less than 200 $mms^{-1}$, 400 $mms^{-1}$, 600 $mms^{-1}$, 800 $mms^{-1}$, 1000 $mms^{-1}$, 1200 $mms^{-1}$, or 1400 $mms^{-1}$.

4. The method according to claim 1, wherein the electron beam scanning velocity is no more than 4500 $mms^{-1}$, 4000 $mms^{-1}$, 3500 $mms^{-1}$, 3000 $mms^{-1}$, 2500 $mms^{-1}$, 2000 $mms^{-1}$, 1800 $mms^{-1}$, or 1600 $mms^{-1}$.

5. The method according to claim 1, wherein the beam current is no less than 10 mA, 15 mA, 20 mA, 30 mA, 40 mA, 50 mA, 60 mA, or 70 mA.

6. The method according to claim 1, wherein the beam current is no more than 110 mA, 100 mA, 90 mA, 85 mA, or 80 mA.

7. The method according to claim 1, wherein the accelerating voltage is no less than 15 kV, 20 kV, 25 kV, 30 kV, or 35 kV.

8. The method according to claim 1, wherein the accelerating voltage is no more than 150 kV, 125 kV, 100 kV, 90 kV, 80 kV, 70 kV, or 65 kV.

9. The method according to claim 1, wherein the spot size of the electron beam at the point of contact on the super-hard material is no more than 300 µm, 100 µm, 50 µm, or 30 µm.

10. The method according to claim 1, wherein the input line energy of the electron beam is in a range 800 $Jm^{-1}$ to 25000 $Jm^{-1}$, 1100 $Jm^{-1}$ to 20000 $Jm^{-1}$, 1500 $Jm^{-1}$ to 15000 $Jm^{-1}$, 2000 $Jm^{-1}$ to 10000 $Jm^{-1}$, or 3000 $Jm^{-1}$ to 5000 $Jm^{-1}$.

11. The method according to claim 1, wherein the surface energy density of the electron beam is in a range 16 $MJm^{-2}$ to 500 $MJm^{-2}$, 22 $MJm^{-2}$ to 400 $MJm^{-2}$, 30 $MJm^{-2}$ to 300 $MJm^{-2}$, 40 $MJm^{-2}$ to 200 $MJm^{-2}$, or 60 $MJm^{-2}$ to 100 $MJm^{-2}$.

12. The method according to claim 1, wherein the energy per unit volume of super-hard material which is volatilized applied by the electron beam is in a range 150 $GJm^{-3}$ to 2300 $GJm^{-3}$, 200 $GJm^{-3}$ to 2000 $GJm^{-3}$, 250 $GJm^{-3}$ to 1700 $GJm^{-3}$, 300 $GJm^{-3}$ to 1400 $GJm^{-3}$, 350 $GJm^{-3}$ to 1100 $GJm^{-3}$, 400 $GJm^{-3}$ to 800 $GJm^{-3}$, or 500 $GJm^{-3}$ to 600 $GJm^{-3}$.

13. The method according to claim 1, wherein during formation of a cut line in the super-hard material the electron beam is periodically moved to a beam dump and then returned to the cut line to continue cutting.

14. The method according to claim 1, wherein during the formation of a first cut line in the super-hard material the electron beam is periodically moved to one or more other locations on the surface of the super-hard material or to another sample of super-hard material to form one or more further cut lines and then returned to the first cut line to continue cutting, periodic switching of the electron beam between cut lines achieving parallel cutting of two or more cut lines in the surface of one or more samples of super-hard material, and wherein the electron beam is a continuous electron beam.

15. The method according to claim 1, wherein the electron beam is a pulsed electron beam.

16. A method according to claim 1, wherein the super-hard material comprises one or more of: a diamond material; a cubic boron nitride material; sapphire; or a composite material comprising one or more of the aforementioned super-hard materials and a binder.

17. The method according to claim 16, wherein the super-hard material comprises at least 50%, 60%, 70%, 80%, 90%, 95%, or 99% by weight of the diamond material, and wherein the accelerating voltage of the electron beam is no more than 80 kV and the diamond material is cut via a thermal cutting mode forming a coating of graphite at sides of a cut region.

* * * * *